United States Patent [19]

Kaneko et al.

[11] Patent Number: 5,231,495
[45] Date of Patent: Jul. 27, 1993

[54] DIGITAL SIGNAL PROCESSING DEVICE TO EXECUTE TIME-SHARING MULTIPLEX OR SEPARATION OF A PLURALITY OF KINDS OF DIGITAL SIGNALS

[75] Inventors: Yushi Kaneko; Shinichi Yamashita, both of Yokohama, Japan

[73] Assignee: Canon Kabushiki Kaisha, Tokyo, Japan

[21] Appl. No.: 722,305

[22] Filed: Jun. 27, 1991

[30] Foreign Application Priority Data

Jun. 28, 1990 [JP] Japan ................................. 2-168515

[51] Int. Cl.[5] ............................................... H04N 5/14
[52] U.S. Cl. .................................... 358/160; 358/143; 370/79; 365/189.02
[58] Field of Search ............. 358/141, 181, 160, 21 R, 358/143; 370/77, 79, 83, 91; 365/189.01, 189.02; 340/722

[56] References Cited

U.S. PATENT DOCUMENTS

| | | | |
|---|---|---|---|
| 4,237,552 | 12/1980 | Aikoh et al. | 370/83 |
| 4,471,348 | 9/1984 | London et al. | 340/722 |
| 4,597,074 | 6/1986 | Demichelis et al. | 370/79 X |
| 4,792,926 | 12/1988 | Roberts | 365/189.02 |
| 4,979,169 | 12/1990 | Almond et al. | 370/79 X |
| 5,031,146 | 7/1991 | Umina et al. | 365/189.02 X |
| 5,111,292 | 5/1992 | Kuriacose et al. | 358/141 X |

Primary Examiner—Victor R. Kostak
Attorney, Agent, or Firm—Fitzpatrick, Cella, Harper & Scinto

[57] ABSTRACT

By providing a mediator for selectively permitting an access request of a first processing circuit for processing a first digital signal to a memory and an access request of a second processing circuit for processing a second digital signal whose bit rate is different from that of the first digital signal to the memory, a process to time-sharing multiplex the first and second digital signals, a process to separate the first and second digital signals from a time-sharing multiplexed signal of the first and second digital signals, and the like are realized while minimizing a scale of hardware.

16 Claims, 3 Drawing Sheets

DIGITAL SIGNAL PROCESSING DEVICE TO EXECUTE TIME-SHARING MULTIPLEX OR SEPARATION OF A PLURALITY OF KINDS OF DIGITAL SIGNALS

BACKGROUND OF THE INVENTION

1. Field of the Invention

The present invention relates to a digital signal processing device to execute a time-sharing multiplex or separation of two kinds of digital signals having different data rates.

2. Related Background Art

To transmit a plurality of kinds of digital signals, ordinarily, a time-sharing multiplex system is used and, in the case where data rates of the digital signals are different, time bases of the digital signals are compressed by time base compressing circuits, thereby matching the transmission data rates. FIG. 1 is a block diagram showing a conventional general construction of a device to time-sharing multiplex a video signal and an audio signal. A video signal is supplied to an input terminal 12. An audio signal is supplied to an input terminal 10. The video signal supplied to the input terminal 12 is converted into the digital signal by a video signal processing circuit 16. The audio signal supplied to the input terminal 10 is converted into the digital signal by an audio signal processing circuit 14. In the video signal and the audio signal, the data rate of the digital signal derived from the video signal of a wide signal band is higher than that of the digital signal derived from the audio signal. Therefore, output signals of the signal processing circuits 14 and 16 cannot be directly multiplexed. Time bases of those output signals are respectively converted by time base conversion circuits 18 and 20 and, thereafter, time base converted output signals of the time base conversion circuits 18 and 20 are multiplexed by a multiplexer 22. To make a data rate of the multiplexed digital signal coincide with a transmission rate of a transmission line, a time base of the multiplexed digital signal is further converted by a time base conversion circuit 24 and an output signal of the time base conversion circuit 24 is sent from an output circuit 26 to the transmission line. Each of the time base conversion circuits 18, 20, and 24, is constructed by a random access memory (RAM). The writing and reading operations of each RAM are controlled by a memory control circuit 28.

As mentioned above, in the case of multiplexing the data of different data rates and transmitting, a number of time base conversion circuits, namely, a number of memories are necessary and a scale of hardware increases, so that it becomes a cause to obstruct the realization of a miniaturization of the apparatus and low costs.

SUMMARY OF THE INVENTION

Under such a background, it is an object of the invention to provide a digital signal processing device which can time base multiplex a plurality of kinds of digital signals by a smaller hardware scale.

To accomplish the above object, according to the invention, there is provided a digital signal processing device comprising: (a) first processing means for processing a first digital signal; (b) second processing means for processing a second digital signal; (c) third processing means for processing a digital multiplex signal which is obtained by time-sharing multiplexing the first and second digital signals; (d) a memory connected to the first to third processing means by buses; and (e) mediation means for selectively permitting a write request of the first processing means to the memory, a write request of the second processing means to the memory, and a read request of the third processing means to the memory.

The above and other objects and features of the present invention will become apparent from the following detailed description and the appended claims with reference to the accompanying drawings.

DETAILED DESCRIPTION OF THE PREFERRED EMBODIMENT

An embodiment of the invention will be described hereinbelow with reference to the drawings.

Figure 2:
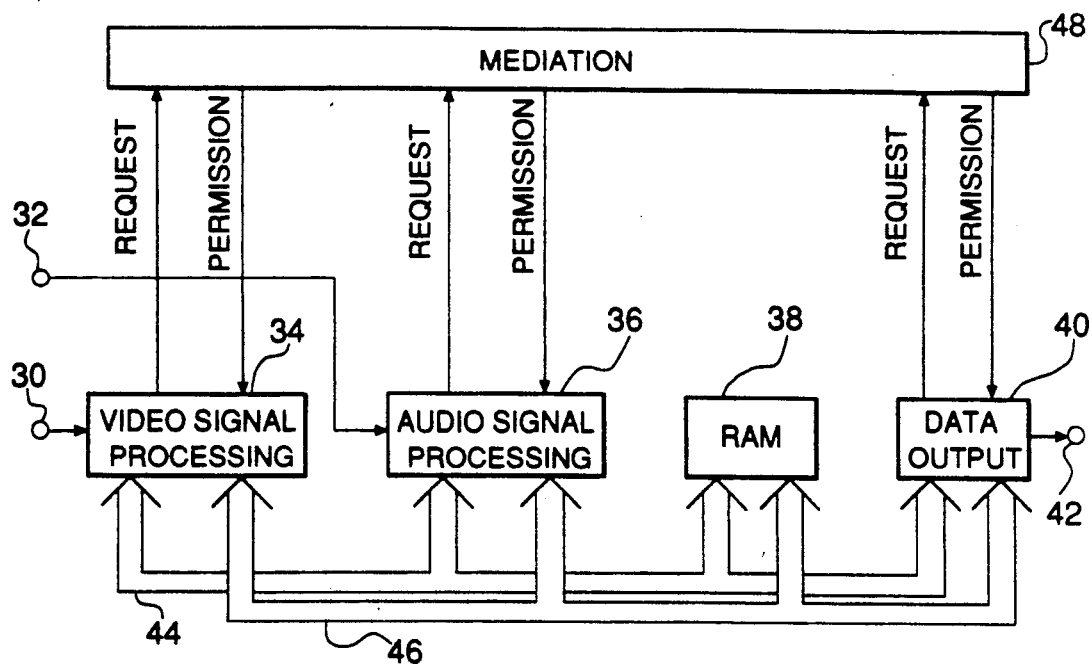
FIG. 2 is a diagram showing a construction of a digital signal processing circuit to execute a time-sharing multiplex according to an embodiment of the invention.
Figure 3:
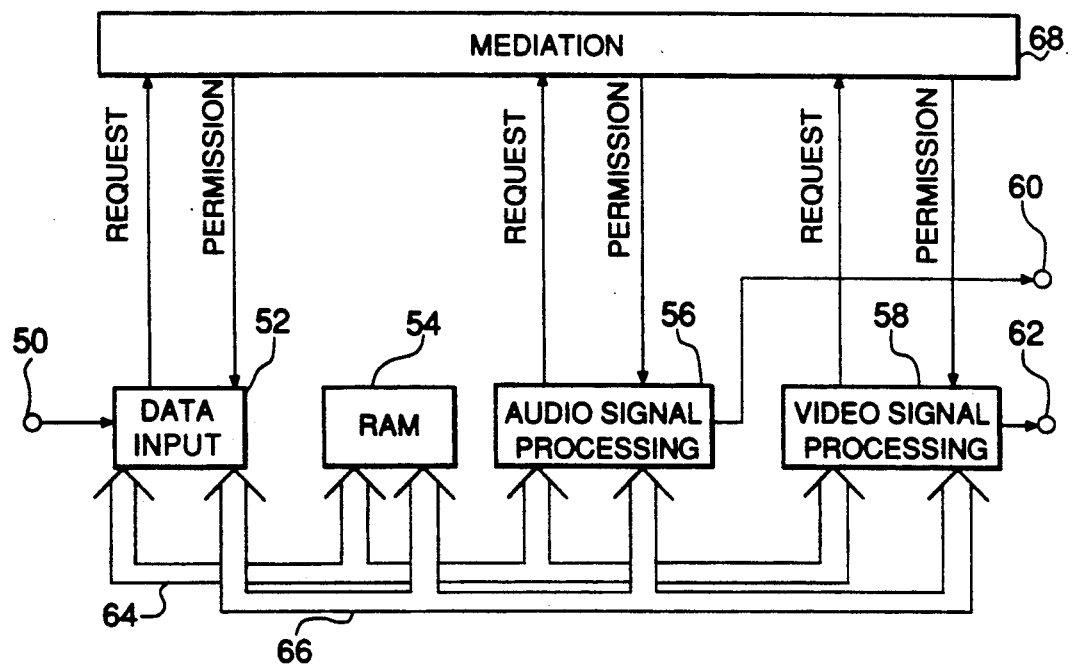
FIG. 3 is a diagram showing a separating circuit to separate digital signals from the signal which has been time-sharing multiplexed by the circuit of FIG. 2.

FIG. 2 is a constructional block diagram of an embodiment in the case where the invention has been applied to a data transmitting apparatus. FIG. 3 shows a constructional block diagram of a corresponding receiving apparatus. In FIG. 2, reference numeral 30 denotes an input terminal of an analog video signal; 32 an input terminal of an analog audio signal; 34 a video signal processing circuit to convert the video signal supplied to the input terminal 30 into the digital signal; 36 an audio signal processing circuit to convert the audio signal supplied to the input terminal 32 into the digital signal; 38 a random access memory (RAM) to execute a time base converting process; and 40 a data output circuit for outputting data which is supplied irregularly in terms of the time to a transmission line for a predetermined time. The data output circuit has an RAM. Reference numeral 42 denotes an output terminal to connect the time-sharing multiplexed digital signal to the transmission line.

The video signal processing circuit 34, audio signal processing circuit 36, RAM 38, and data output circuit 40 are mutually connected by a data bus 44 and an address bus 46. Reference numeral 48 denotes a mediation circuit to mediate use requests of the RAM 38 from the video signal processing circuit 34, audio signal processing circuit 36, and data output circuit 40.

The operation of the apparatus of FIG. 2 will now be described. The video signal processing circuit 34 samples the video signal supplied to the input terminal 30 by a predetermined frequency and converts it digital codes. The audio signal processing circuit 36 converts the audio signal supplied to the input terminal 32 into digital codes. Since a frequency band of the video signal is wider than that of the audio signal, a sampling frequency of the video signal is higher than that of the audio signal. A data rate of the digital video signal obtained as mentioned above, therefore, is higher than that of the digital audio signal. After the video signal processing circuit 34 and the audio signal processing circuit 36 sample the input signals, they generate and send memory access request signals to the mediation circuit 48. The mediation circuit 48 permits the writing operation into the RAM 38 in accordance with a predetermined priority order (in the embodiment, the video signal processing circuit has a priority to the audio signal processing circuit). Although the writing operation of the audio signal into the RAM 38 is executed after completion of the writing operation of the video signal into the RAM 38, no problem occurs because the sampling frequency of the audio signal is fairly lower than the sampling frequency of the video signal.

After the video signal and audio signal are written into the RAM 38, the data output circuit 40 generates and sends a memory access request signal to the mediation circuit 48. The data stored in the RAM 38 is read out under mediation of the mediation circuit 48 and is temporarily stored into an internal memory. The storage data is read out of the internal memory so that a rate of data which is generated from the output terminal 42 coincides with a transmission rate of an external transmission system. It is needless to say that a bit rate of the multiplex data derived by time-sharing multiplexing the video data and the audio data is set to be lower than a permission bit rate of the external transmission system.

A receiving apparatus shown in FIG. 3 will now be described. Reference numeral 50 denotes an input terminal to which the digital reception signal from the transmission line is supplied; 52 a data input circuit; 54 an RAM; 56 an audio signal processing circuit to return the received audio code data into the analog signal; 58 a video signal processing circuit to return the received video code data into the analog signal; 60 an output terminal of the analog audio signal; 62 an output terminal of the analog video signal; 64 a data bus to mutually connect the data input circuit 52, RAM 54, audio signal processing circuit 56, and video signal processing circuit 58; 66 an address bus to mutually connect the data input circuit 52, RAM 54, audio signal processing circuit 56, and video signal processing circuit 58; and 68 a mediation circuit to mediate accesses to the RAM 54 by the data input circuit 52, audio signal processing circuit 56, and video signal processing circuit 58.

The operation of the apparatus of FIG. 3 will now be described. The data supplied to the input terminal 50 from the transmission line is temporarily stored into an internal memory of the data input circuit 52 in order to absorb a difference between a data rate of the transmission line and a processing speed of the RAM 54 or the like. To transfer the storage data in the internal memory to the RAM 54, the data input circuit 52 sends a memory access request to the mediation circuit 68. When a memory access is permitted by the mediation circuit 68, the storage data in the internal memory is written into the RAM 54.

To read out the storage data from the RAM 54, the video signal processing circuit 58 and the audio signal processing circuit 56 send memory access requests to the mediation circuit 68. The mediation circuit 68 preferentially permits the requests in accordance with the priority order similar to that in the case of the transmission, that is, for the request from the video signal processing circuit 58. Although the memory access to the RAM 54 by the audio signal processing circuit 56 is executed after the memory access by the video signal processing circuit 58, no problem occurs because of the difference of the data rates as mentioned above. The video signal processing circuit 58 which has received the memory access permission reads out the video data from the RAM 54 and converts it the analog video signal and supplies the analog video signal to the output terminal 62. The audio signal processing circuit 56 which has received the memory access permission reads out only the audio signal from the RAM 54 and converts it the analog audio signal and supplies the analog audio signal to the output terminal 60.

By previously dividing the transmission data into blocks on the transmission side and adding an address ID flag to each block, the audio data and the video data can be easily discriminated.

Figure 4:
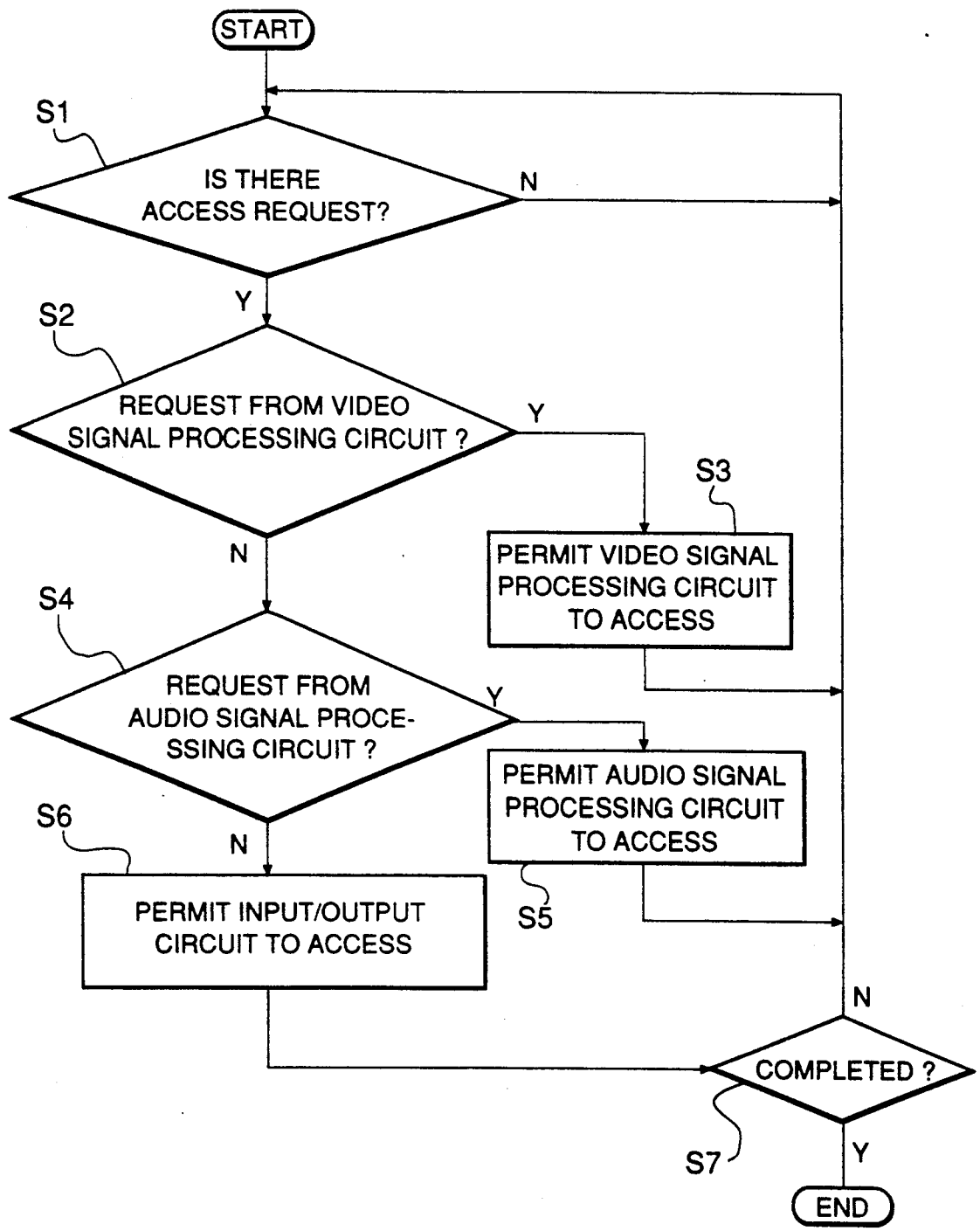
FIG. 4 is a flowchart for explaining the operation of a mediation circuit in FIGS. 2 and 3.

FIG. 4 shows a flowchart for discriminating processes of the priority orders in the mediation circuits 48 and 68. As will be obviously understood from FIG. 4, the priority orders are set such that video signal processing circuits 34 and 58, audio signal processing circuits 36 and 56, and output circuit 40 or input circuit 52.

That is, the mediation circuits 48 and 68 discriminate the presence or absence of the access request in step S1. If there is the memory access request, a check is first made to see if the access requests have been sent from the video signal processing circuits 34 and 58 at the above timings or not in step S2.

If no access request is sent from the video signal processing circuits 34 and 58, even if access requests have simultaneously been sent from the other circuits, namely, from the audio signal processing circuits 36 and 56, the output circuit 40, or the input circuit 52, a permission of the access is given to the video signal processing circuits 34 and 58 in response to the access requests therefrom (step S3).

If it is determined in step S2 that no access request is sent from the video signal processing circuits 34 and 58, a check is made to see if the access requests have been sent from the audio signal processing circuits 36 and 56 at the above timings or not (step S4).

At this time, if the access requests have been sent from the audio signal processing circuits 36 and 56, even if the access request has simultaneously been sent from the output circuit 40 and the input circuit 52, a permission of the access is given to the audio signal processing circuits 36 and 56 in response to the access requests therefrom (step S5).

If it is determined in step S4 that no access request is sent from the audio signal processing circuits 36 and 56 as well, it is possible to decide such that access request at that timing has been made from the output circuit 40 or the input circuit 52, so that a permission of the access is given to the output circuit 40 or the input circuit 52 (step S6). The operations in the above steps S1 to S6 are repeated until the end of the processes is determined in step S7.

Figure 1:
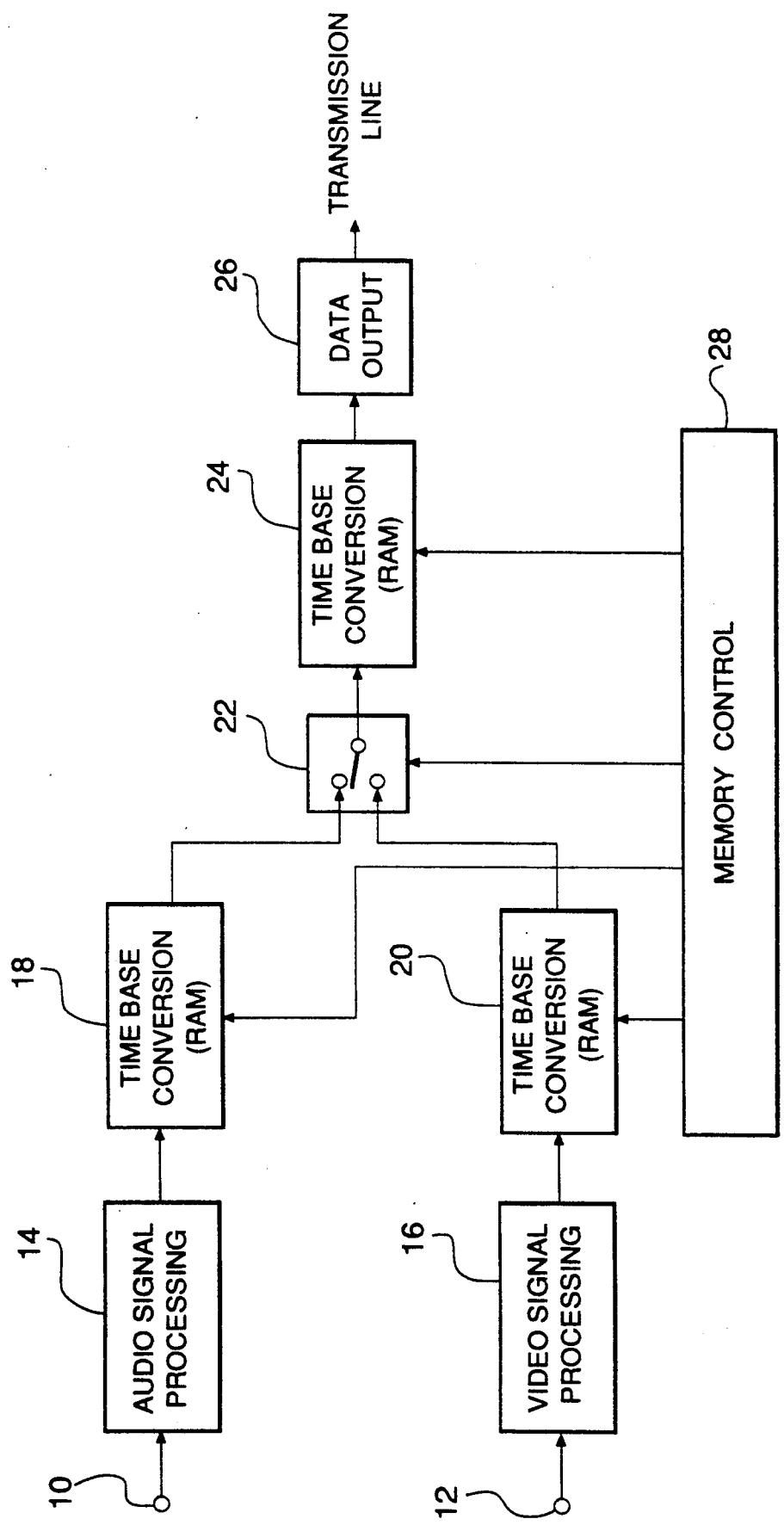
FIG. 1 is a diagram showing a general construction of a conventional digital signal processing circuit to execute a time-sharing multiplex.

By constructing as mentioned above, by merely providing single RAMs 38 and 54, it is possible to realize the time-sharing multiplex of the digital video signal and the digital audio signal and the separation of the digital video signal and the digital audio signal from the time-sharing multiplexed digital signal. For instance, the scale of the hardware is extremely reduced as compared with that of the conventional circuit shown in FIG. 1.

As will be easily understood from the above description, according to the invention, there are advantages such that the device for executing a timesharing multiplex or separation of a plurality of kinds of digital signals can be miniaturized and that it is possible to easily cope with the addition of the multiplex data.

We claim:

1. A digital signal processing device comprising:
   (a) first processing means for processing a first digital signal;
   (b) second processing means for processing a second digital signal;
   (c) third processing means for processing a digital multiplex signal which is obtained by time-sharing multiplexing the first and second digital signals;
   (d) a memory connected to the first to third processing means by buses; and
   (e) mediation means for selectively permitting a write request of the first processing means to the memory, a write request of the second processing means to the memory, and a read request of the third processing means to the memory.

2. A device according to claim 1, wherein the mediation means gives priorities to the write request of the first processing means to the memory and the write request of the second processing means to the memory than the read request of the third processing means to the memory.

3. A device according to claim 2, wherein the third processing means has an internal memory.

4. A device according to claim 1, wherein a data rate of the first digital signal is higher than a data rate of the second digital signal and the mediation means gives a priority to the write request of the first processing means to the memory than the write request of the second processing means to the memory.

5. A device according to claim 4, wherein the mediation means gives a priority to the write request of the second processing means to the memory than the read request of the third processing means to the memory.

6. A device according to claim 5, wherein the third processing means has an internal memory.

7. A device according to claim 4, wherein the first digital signal is a digital video signal and the second digital signal is a digital audio signal.

8. A digital signal processing device comprising:
   (a) first processing means for processing a first digital signal;
   (b) second processing means for processing a second digital signal;
   (c) third processing means for processing a digital multiplex signal which is obtained by time-sharing multiplexing the first and second digital signals;
   (d) a memory connected to the first, second, and third processing means by buses; and
   (e) mediation means for selectively permitting a read request of the first processing means to the memory, a read request of the second processing means to the memory, and a write request of the third processing means to the memory.

9. A device according to claim 8, wherein the mediation means gives priorities to the read request of the first processing means to the memory and the read request of the second processing means to the memory than the write request of the third processing means to the memory.

10. A device according to claim 9, wherein the third processing means has an internal memory.

11. A device according to claim 8, wherein a data rate of the first digital signal is higher than a data rate of the second digital signal and the mediation means gives a priority to the read request of the first processing means to the memory than the read request of the second processing means to the memory.

12. A device according to claim 11, wherein the mediation means gives a priority to the read request of the second processing means to the memory than the write request of the third processing means to the memory.

13. A device according to claim 12, wherein the third processing means has an internal memory.

14. A device according to claim 11, wherein the first digital signal is a digital video signal and the second digital signal is a digital audio signal.

15. A digital signal processing device comprising:
   (a) first processing means for processing a first digital signal;
   (b) second processing means for processing a second digital signal;
   (c) third processing means for processing a digital multiplex signal which is obtained by time-sharing multiplexing the first and second digital signals;
   (d) a memory connected to the first, second, and third processing means by buses; and
   (e) mediation means for selectively permitting an access request of the first processing means to the memory, an access request of the second processing means to the memory, and an access request of the third processing means to the memory.

16. A digital signal processing device comprising:
   (a) video processing means for processing a digital video signal;
   (b) audio processing means for processing a digital audio signal;
   (c) a memory connected to the video processing means and the audio processing means by buses; and
   (d) mediation means for selectively permitting an access request of the video processing means to the memory and an access request of the audio processing means to the memory so as to give a priority to the access request of the video processing means to the memory than the access request of the audio processing means to the memory.

* * * * *

UNITED STATES PATENT AND TRADEMARK OFFICE
CERTIFICATE OF CORRECTION

PATENT NO. : 5,231,495
DATED : July 27, 1993
INVENTOR(S) : YUSHI KANEKO, ET AL.

It is certified that error appears in the above-identified patent and that said Letters Patent is hereby corrected as shown below:

COLUMN 2

Line 60, "it" should read --it into--.

COLUMN 3

Line 16, "the-media-" should read --the media- --.

COLUMN 4

Line 3, "it" should read --it into--.
Line 8, "it" should read --it into--.

Signed and Sealed this

Third Day of May, 1994

Attest:

BRUCE LEHMAN

Attesting Officer

Commissioner of Patents and Trademarks